United States Patent
Lopez et al.

(10) Patent No.: US 7,199,031 B2
(45) Date of Patent: Apr. 3, 2007

(54) SEMICONDUCTOR SYSTEM HAVING A PN TRANSITION AND METHOD FOR MANUFACTURING A SEMICONDUCTOR SYSTEM

(75) Inventors: Maria Del Rocio Martin Lopez, Reutlingen (DE); Richard Spitz, Reutlingen (DE); Alfred Goerlach, Kusterdingen (DE); Barbara Will, Harrenberg (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/501,287

(22) PCT Filed: Nov. 19, 2002

(86) PCT No.: PCT/DE02/04255

§ 371 (c)(1),
(2), (4) Date: Jan. 18, 2005

(87) PCT Pub. No.: WO03/061015

PCT Pub. Date: Jul. 24, 2003

(65) Prior Publication Data

US 2005/0121690 A1 Jun. 9, 2005

(30) Foreign Application Priority Data

Jan. 15, 2002 (DE) .............................. 102 01 162
Aug. 16, 2002 (DE) .............................. 102 37 409

(51) Int. Cl.
*H01L 21/22* (2006.01)

(52) U.S. Cl. ...................... 438/549; 438/965; 438/496; 438/412; 438/413

(58) Field of Classification Search ............... 438/116, 438/113, 465, 558, 549, 965, 496, 412, 413
See application file for complete search history.

(56) References Cited

U.S. PATENT DOCUMENTS

| 4,047,196 | A | * | 9/1977 | White et al. ............... 257/496 |
| 5,150,176 | A | * | 9/1992 | Schoenberg ............... 257/496 |
| 5,930,660 | A | * | 7/1999 | Davis ....................... 438/549 |
| 6,054,748 | A | * | 4/2000 | Tsukuda et al. ........... 257/496 |
| 6,727,525 | B1 | * | 4/2004 | Goerlach .................. 257/107 |

FOREIGN PATENT DOCUMENTS

| DE | 43 20 780 | | 3/1995 |
| DE | 198 04 580 | | 8/1999 |
| JP | 56 004285 | * | 1/1981 |
| WO | WO 93 08592 | | 4/1993 |
| WO | WO 01 75966 | | 10/2001 |

* cited by examiner

*Primary Examiner*—Zandra V. Smith
*Assistant Examiner*—Tsz Chiu
(74) *Attorney, Agent, or Firm*—Kenyon & Kenyon LLP

(57) ABSTRACT

A semiconductor system having a pn transition and a method for manufacturing a semiconductor system are disclosed. The semiconductor system is designed in the form of a chip having an edge region, the semiconductor system includes a first layer of a first conductivity type and a second layer of a second conductivity type, which is of opposite polarity to the first conductivity type. The first layer has an edge region and a center region, the pn transition being provided between the first layer and the second layer. The second layer is more weakly doped in its edge region than in its center region, and the boundary surface of the pn transition at the edge region is non-parallel to the main chip plane.

4 Claims, 2 Drawing Sheets

US 7,199,031 B2

SEMICONDUCTOR SYSTEM HAVING A PN TRANSITION AND METHOD FOR MANUFACTURING A SEMICONDUCTOR SYSTEM

FIELD OF THE INVENTION

The present invention is directed to a semiconductor system and a method as recited in the other independent claims.

BACKGROUND INFORMATION

Semiconductor diodes for voltage limitation are generally known and are generally designed as pn-type diodes in such a way that a p-layer is diffused into a homogeneously doped n-doped area. In order to reduce the bulk resistance and to improve the ohmic connection of the n-type semiconductor to the metal plating, the n-doped area is often n-doped from the back of the wafer.

A semiconductor diode is known from the printed matter German Patent Application No. 4,320,780, in which the field strength occurring in the edge region of the semiconductor chip is lower than the field strength in the interior of the component.

SUMMARY OF THE INVENTION

The semiconductor system of the present invention and the method of the present invention have the advantage over the related art in that the semiconductor system for reducing the field strength on the chip edge as well as the manufacture of the semiconductor system are substantially simpler.

DETAILED DESCRIPTION

Figure 1:
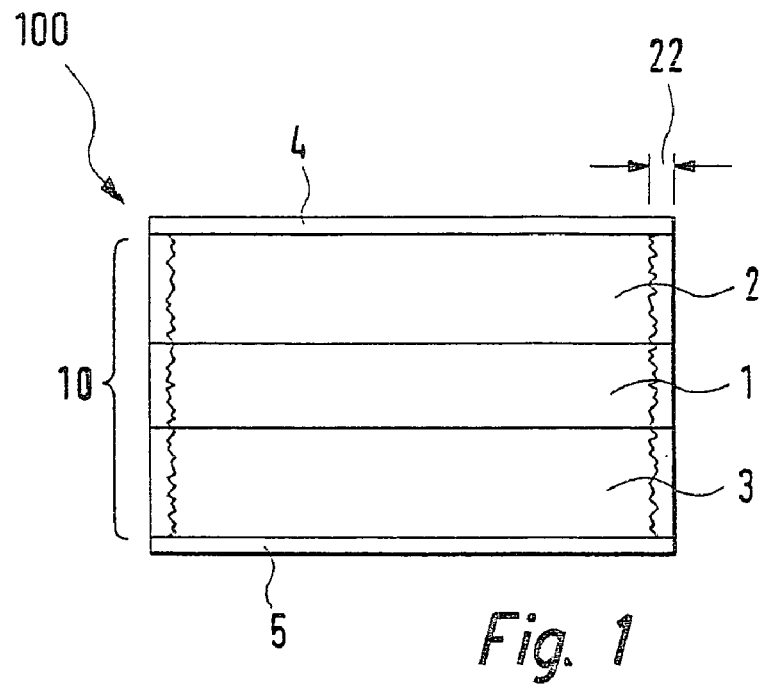
FIG. 1 shows a schematic representation of the cross-section of a known diode.

A known diode 100 is shown in cross-section in FIG. 1. Semiconductor diodes 100 for voltage limitation are usually designed as pn-type diodes in such a way that a p-doped layer 2, which is also denoted below as first layer 2, is diffused into a homogeneously n-doped area 1. In order to reduce the bulk resistance and for a better ohmic connection of the n-type semiconductor to the metal plating, n-doped area 1 is strongly n-doped from the back of the wafer, which in all the figures is to be thought of as to be in the lower part of the figure. This results in a third layer 3 denoted by reference symbol 3. The reference to n-doping or p-doping for specific layers or areas is only to be understood as exemplary in FIG. 1 and in all additional figures; according to an example embodiment of the present invention, the charge carrier type used for the doping may also be interchanged. Together, layers 1, 2, 3 make up the semiconductor body denoted as chip 10. Silicon in particular may be considered as a possible semiconductor material; however, another semiconductor material may also be used. This statement also applies to all subsequent figures.

An upper-side metallization 4 and a lower-side metallization 5 are also shown in FIG. 1.

If a reverse voltage $U_s$ is applied to such a diode 100, the current increases sharply as soon as Zener voltage $U_z$ is exceeded. The cause of the current increase, i.e., the voltage limitation, is based on the onset of the avalanche effect. When a reverse voltage $U_s$ is applied, a space charge region forms at the pn boundary surface, i.e., at the pn transition. From a specific electrical field strength $E_{crit}$ of approximately $(2-4)*10^5$ V/cm, charge carriers in the space charge region are accelerated so strongly that when they strike the crystal lattice, they break open bonds of the semiconductor and thus produce additional electrons and holes, which in turn are accelerated and are able to break open bonds. As a result, the current may increase beyond all bounds, i.e. it may become very high. In known diode 100 according to FIG. 1, the pn transition ends in the area of a saw trench of the chip. To manufacture diode 100, a plurality of diode chips 10 may be manufactured and processed together as a wafer. This plurality of chips 10 may subsequently be separated. This may be carried out, for example, by sawing. This results in saw trenches, which are not, however, denoted individually by a reference symbol in FIG. 1 but instead are merely identifiable as an edge of the chip. Depending on the saw type and sawing process, the crystal lattice in the area of the saw trenches may be disrupted up to a depth, i.e., in a direction parallel to the chip plane, of several micrometers to several tens of micrometers. Such areas, which are denoted in the following as damage zones, have high energy state densities in the band gap. The damage zone, i.e., its width and depth, is denoted in FIG. 1 by reference symbol 22. The high energy state density in the band gap increases the recombination probability for charge carriers and accordingly the cutoff current. The electrical field strength required for triggering the avalanche effect is essentially lower in the area of the damage zone than in the inner, undisrupted chip area. For that reason, the avalanche breakdown in diode 100 occurs first at the chip edge. The consequences of this are preliminary breakdowns, which are expressed as rounded reverse characteristics. Therefore, since the current density is increased in these edge regions, pn-type diode 100 is subjected to a greater thermal stress at the chip edge than in the center. The consequence of this is significantly reduced pulse resistance of the diode. In such diodes 100, it is therefore customary to erode away the disrupted chip area, i.e., the damage zone, by etching using the KOH method, for example.

Figure 2:
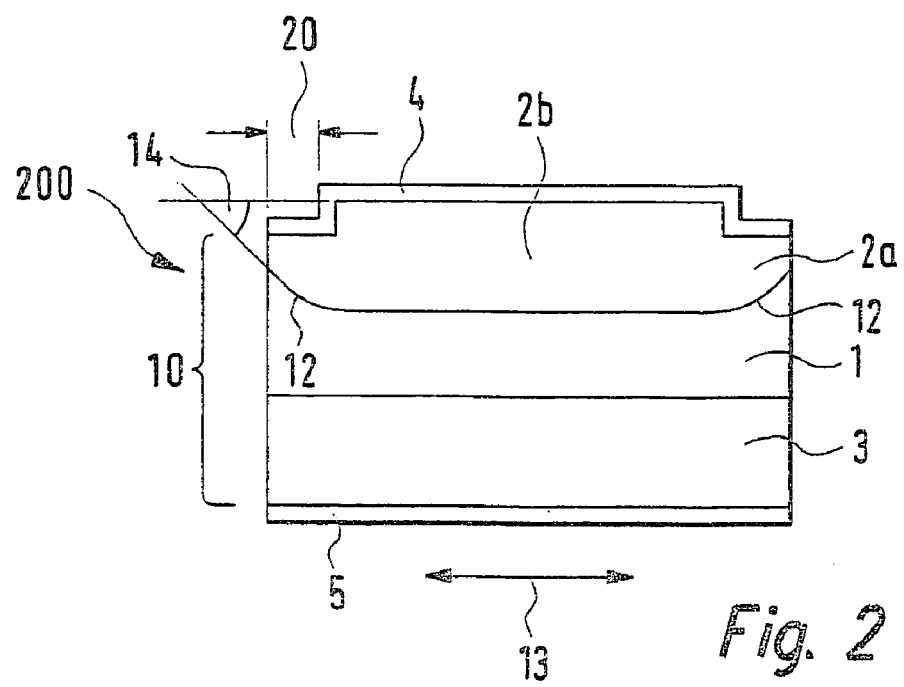
FIG. 2 shows a schematic representation of the cross-section of a semiconductor system according to an example embodiment of the present invention.

FIG. 2 shows a schematic representation of the cross-section of a semiconductor system 200 according to an example embodiment of the present invention. Chip 10, i.e., semiconductor substrate 10, includes first layer 2, which is p-doped, for example. Furthermore, chip 10 includes second layer 1, which is n-doped, for example. P-doped first layer 2 is introduced into semiconductor material 10 in a specially patterned manner so that an edge region 2a of first layer 2 suggested in FIG. 2 and a center region 2b of first layer 2 are produced. Edge region 2a has a lower dopant concentration than center region 2b in the chip center. Furthermore, the boundary surface between p-doped first layer 2 and n-doped second layer 1, the boundary surface in FIG. 2 being denoted by reference symbol 12, no longer runs parallel to the wafer surface or to the chip plane, which is denoted in FIG. 2 by a double arrow and reference symbol 13, in edge region 2a of first layer 2. In edge region 2a, boundary surface 12 is bent in the direction of first layer 2, i.e., in the direction of the top of the chip. Both properties, the low p-doping concentration and the non-parallelism of pn transition 12 increase critical field strength $E_{crit}$ in edge region 2a of chip 10. This causes the avalanche breakdown to take place in the inside of chip 10, i.e., in center region 2b of first layer 2 and not at the chip edge. This results in low cutoff currents and higher pulse resistances. In addition, in most cases, it is possible to dispense with the costly removal of the damage zone (which is not shown in FIG. 2 for the sake of simplicity) by etching. The lower doping of edge region 2a results in a pn-type diode having a higher Zener voltage at the chip edge than in center region 2b because the space charge region extends further into edge region 2a than into center region 2b. In blocking operation, edge region 2a does not reach avalanche breakdown because the inner diode, i.e., the pn transition between center region 2b and second layer 1 prevents a voltage rise beyond the Zener voltage, which is critical for edge region 2a. The non-parallelism of pn transition 12 in edge region 2a in relation to chip plane 13 corresponds to the principle of positive beveling, which also results in a greater local Zener voltage. As a result of the charge neutrality, the space charge region at the edge expands further than in the parallel case so that the electrical field strength on the surface, i.e., at edge region 2a is reduced still further. The positive beveling of boundary surface 12 of an example embodiment of the present invention, i.e., the "bending" of edge region 12 upwards, results in a varying angle between boundary surface 12 and the chip surface, i.e., of chip plane 13, due to a separation of chip 10 of a wafer at specific points of curved or bent boundary surface 12 as a function of the point at which the boundary surface curve of boundary surface 12 of chip 10 is separated. This angle is also called the beveling angle and is provided with reference symbol 14 in FIG. 2. The smaller a remaining sub-region is after the separation of chip 10, the smaller beveling angle 14 is—under otherwise identical conditions. For example, the beveling angle of semiconductor system 200 of an example embodiment of the present invention is at least 45°. The sub-region remaining after the separation of chips 10 is provided with reference symbol 20 in FIG. 2. Except for the saw blade width during separation, which is described below in connection with FIG. 3—this width essentially corresponds to one-half the width of sub-region 7, which is described in greater detail below in connection with FIG. 3b.

FIG. 3 shows an example of a manufacturing process of semiconductor system 200 of an example embodiment of the present invention or of diode 200 of an example embodiment of the present invention. Diode 200 has, for example, a Zener voltage of approximately 50 V. Of course, such a diode may also be designed for higher or lower voltages.

Figure 3A:
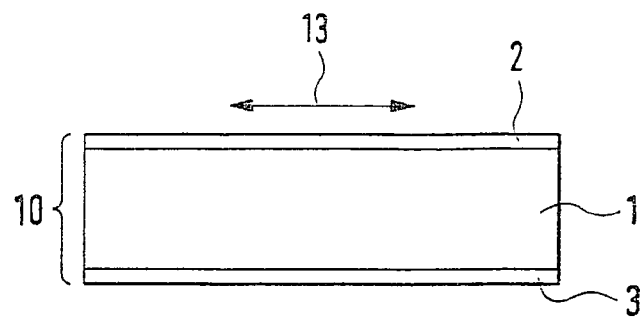
FIG. 3 shows a schematic representation of the steps for manufacturing the semiconductor system according to an example embodiment of the present invention.

The front, i.e., the top in the systems shown, of silicon substrate 10, i.e., chip 10, having a thickness of approximately 200 μm and an n-doping of approximately $2.6*10^{17}$ cm$^{-3}$, is coated with boron, and the back, i.e., the bottom in the systems shown, is coated with phosphorus. This results in a system shown in FIG. 3a having first layer 2 doped with boron in the example, second layer 1 provided with the basic n-doping, and third layer 3 doped with phosphorus in the example. Above FIG. 3a, chip plane 13 is also here indicated by a double arrow. According to an example embodiment of the present invention, the coating of boron or phosphorus may be applied, for example, by ion implantation, via a doping glass or via a doping film. In particular, doped glass layers may be applied using the APCVD method (atmospheric pressure chemical vapor deposition) or doping films may be used in a known manner. This method makes it advantageously possible to apply dopants virtually simultaneously to the front, boron for example, and to the back, phosphorus for example. In the case of the doped APCVD glasses, a subsequent diffusion takes place at high temperatures for approximately 0.5–3 hours. In film coating, diffusion takes place for 0.5–3 hours at 1265° C. in an oxygen-containing atmosphere. After that, the silicon wafer or chip 10 is in a condition as shown in FIG. 3a. The boron and phosphorus doses, respectively, amount for example, to $(1-2)*10^{17}$ cm$^{-2}$.

Figure 3B:
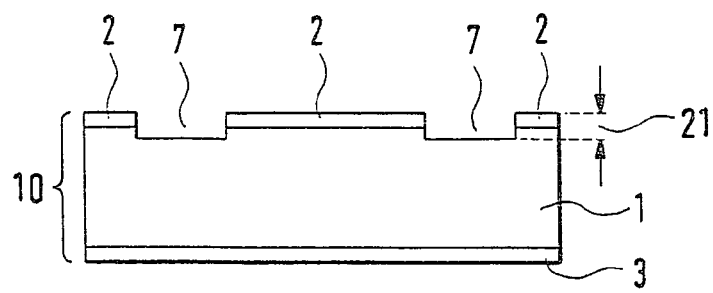

The front of the wafer may then be patterned. This may be carried out, for example, by making saw cuts in the front using a diamond saw or by water-cooled laser cutting. FIG. 3b shows resulting chip 10, i.e., wafer, after the structuring step. The saw depth, which is denoted in FIG. 3b by reference symbol 21, amounts to 5–35 μm, for example. Normally, saw depth 21 is selected in such a way that it is deeper than the depth of penetration of boron layer 2, i.e., of first layer 2, into n-doped second layer 1. The selection of the saw depth makes it possible to influence the lateral outward diffusion of the boron layer or the boron concentration—and accordingly the breakdown field strength at the chip edge—in the subsequent diffusion. The greater saw depth 21 is, the lesser is the lateral outward diffusion and critical field strength $E_{crit}$ at the chip edge. The width of the saw blade is based on saw depth 21 and the subsequent diffusion process; typical saw widths are 100 μm. Sawing removes a sub-region of the front of the chip. This sub-region is denoted by reference symbol 7 in FIG. 3b. The width of sub-region 7 corresponds to the saw width.

If the dopants are already introduced into the front of the wafer in a patterned manner, the saw cut may be unnecessary.

Figure 3C:
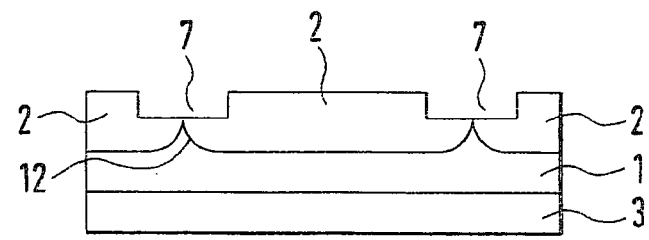

After the structuring process, the actual diffusion takes place, i.e., the dopants are driven into the semiconductor material of chip 10, i.e., into the silicon. According to an example embodiment of the present invention, diffusion takes place at 1265° C. for 90 hours. A doping profile as shown in FIG. 3c is obtained. The dopants that are deposited in the bottom of wafer 10, i.e., of chip 10, i.e., in third layer 3, (see FIG. 3a or FIG. 3b), as a result of the diffusion step, migrate upwards into the semiconductor material, which is provided with the basic doping. As a result, the area of third layer 3 is expanded or enlarged at the expense of the area of second layer 1 in wafer 10. According to an example embodiment of the present invention, the dopants deposited in the top of wafer 10 are provided in a patterned manner, i.e., they do not extend over the entire surface of wafer 10 or of chip 10, but instead only into the sub-regions of first layer 2, i.e., no dopant of first layer 2 is present in the chip areas under sub-regions 7 (see FIG. 3b and 3c). However, as a result of the diffusion, the dopant, which was introduced in a patterned manner into the top of wafer 10 migrates "vertically" downwards into the chip areas of layer 1 provided with the basic doping and reduces this second layer 1 in turn to the benefit of first layer 2. However, the dopant also migrates "laterally" into the areas of second layer 1, which are located under sub-region 7. However, this reduces their concentration the further the dopant has traveled into sub-region 7 or into the wafer area lying under it. In the area under sub-region 7, i.e., under saw trench 7, the boron dopant concentration is therefore reduced compared to the concentration in the center between two sub-regions 7. Furthermore, the diffusion in the described patterned deposition of the dopants on the top of chip 10 also causes the curve of the pn diffusion front, i.e., the curve of boundary surface 12 between positively doped first layer 2 (in the example) and negatively doped second layer 1 (in the example), to have the desired and advantageous structure or shape. In the chip area under sub-region 7, boundary surface 12 exhibits a curve extending upwards, i.e., a curve which is not parallel to chip plane 13.

Figure 3D:
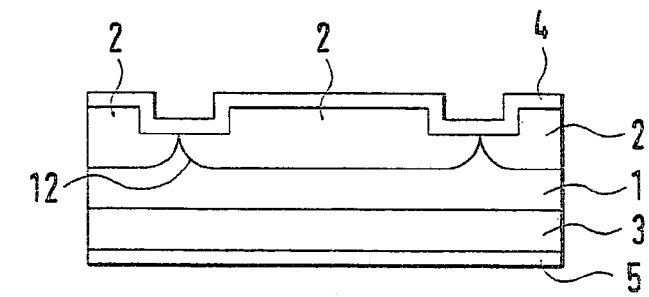
Figure 3E:
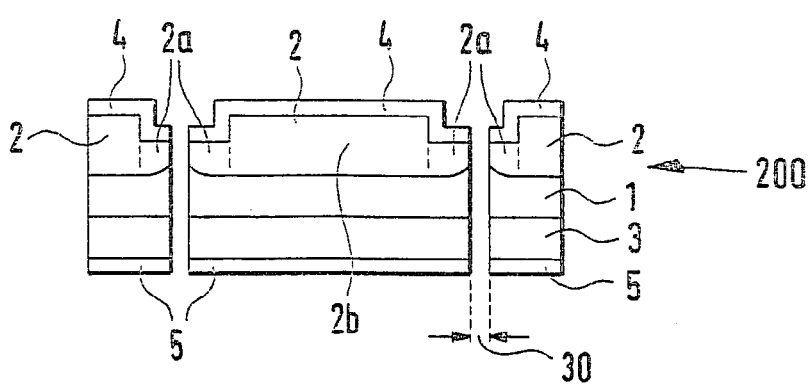

After the diffusion step, in accordance with an example embodiment of the present invention, the front and back of the wafer, i.e., the top and bottom of the wafer, are provided with upper-side metallization 4 or lower-side metallization 5, as is shown in FIG. 3d. Metal layers 4, 5 are used to contact chip 10. According to an example embodiment of the invention, a chromium/nickel/silver metal plating may be used, for example.

After the metallization, individual chips 10 are separated, by sawing, for example, by using a diamond saw, for example. According to an example embodiment of the present invention, a diamond saw having a saw blade width of 40 µm, for example, may be suitable for this purpose. The saw blade width for separating chips 10 is denoted in FIG. 3e by reference symbol 30. According to an example embodiment of the present invention, the separation of chips 10 of a wafer produces pn diode chips 200 or semiconductor systems 200 having reduced edge field strength. In doing so, the beveling angle in edge region 2a of semiconductor system 200 may be defined and set.

According to an example embodiment of the present invention, diode chips 200 or semiconductor system 200 may be packaged in a known manner in a housing, which is not shown, in a diode press-fit housing, for example.

Because the separation of diode chips 200 using a saw under unfavorable sawing parameters—as a function, for example, of the grain of the diamond splinters, the feed motion, the rotational speed and the like—produces very large damage zones 22 on the chip edge, it may be provided that this damage zone 22 on the chip edge is removed, for example using wet chemical methods, for example, KOH etching, gas phase etching or the like. However, it may be advantageous to implement the separation process using other non-destructive methods such as, for example, etching or water-cooled laser cutting. As a result, it may be possible to eliminate the removal of damage zone 22.

What is claimed is:

1. A method for manufacturing a semiconductor system, comprising:
    forming a pn transition;
    forming a chip having an edge region, the chip including a first layer of a first conductivity type and a second layer of a second conductivity type opposite to that of the first conductivity type, the first layer having the edge region and a center region, the pn transition being provided between the first layer and the second layer;
    doping the second layer more weakly in the edge region than in the center region, wherein a boundary surface of the pn transition is non-parallel to the main chip plane at the edge region; and
    wherein the first layer is manufactured using patterned doping, and wherein the patterned doping is provided by pre-coating the chip with dopant, subsequently removing the coating in a sub-region of the chip, and subsequently introducing the dopant into the chip.

2. The method of claim 1, wherein the coating is removed by sawing.

3. The method of claim 2, wherein the sawing is performed with at least one of a diamond saw and water-supported laser cutting.

4. The method of claim 1, wherein the chip is pre-coated with dopant via at least one of APCVD deposition of a doped glass, a doping film, a gas phase coating, ion implantation, and an application of doping pastes.

* * * * *